United States Patent
Lu et al.

(10) Patent No.: US 7,253,049 B2
(45) Date of Patent: Aug. 7, 2007

(54) METHOD FOR FABRICATING DUAL WORK FUNCTION METAL GATES

(75) Inventors: Jiong-Ping Lu, Richardson, TX (US); Shaofeng Yu, Plano, TX (US); Haowen Bu, Plano, TX (US); Lindsey H. Hall, Plano, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 236 days.

(21) Appl. No.: 11/017,469

(22) Filed: Dec. 20, 2004

(65) Prior Publication Data

US 2006/0134844 A1 Jun. 22, 2006

(51) Int. Cl.
*H01L 21/8238* (2006.01)

(52) U.S. Cl. .............................. 438/231; 257/E21.637

(58) Field of Classification Search ................ 438/228, 438/232, 283, 532; 257/E21.637
See application file for complete search history.

(56) References Cited

U.S. PATENT DOCUMENTS

| | | | | |
|---|---|---|---|---|
| 4,866,002 A | * | 9/1989 | Shizukuishi et al. ........ | 438/217 |
| 5,780,330 A | * | 7/1998 | Choi ........................... | 438/232 |
| 6,376,342 B1 | * | 4/2002 | Tseng ......................... | 438/517 |
| 2002/0110986 A1 | * | 8/2002 | Rhodes ....................... | 438/283 |

OTHER PUBLICATIONS

Haowen Bu, et al, "Semiconductor Device Having a Fully Silicided Gate Electrode and Method of Manufacture Therefor" U.S. Appl. No. 10/808,168, filed Mar. 24, 2004.

Jiong-Ping Lu, et al, "Method For Manufacturing A Semiconductor Device Having A Silicided Gate Electrode And A Method For Manufacturing An Integrated Circuit Including The Same" U.S. Appl. No. 10/810,759, filed Mar. 26, 2004.

Shaofeng Yu, et al, "A Method for Manufacturing a Silicided Gate Electrode Using a Buffer layer" Patent Application Filed Dec. 8, 2004.

* cited by examiner

*Primary Examiner*—Chandra Chaudhari
(74) *Attorney, Agent, or Firm*—Rose Alyssa Keagy; W. James Brady; Frederick J. Telecky, Jr.

(57) ABSTRACT

A method for making PMOS and NMOS transistors 60, 70 on a semiconductor substrate 20 that includes having a gate protection layer 210 over the gate electrode layer 110 during the formation of source/drain silicides 120. The method may include implanting dopants into a gate polysilicon layer 115 before forming the protection layer 215.

30 Claims, 13 Drawing Sheets

METHOD FOR FABRICATING DUAL WORK FUNCTION METAL GATES

BACKGROUND OF THE INVENTION

This invention relates to the fabrication of dual work function metal gates for CMOS devices.

DETAILED DESCRIPTION OF THE INVENTION

Figure 1:
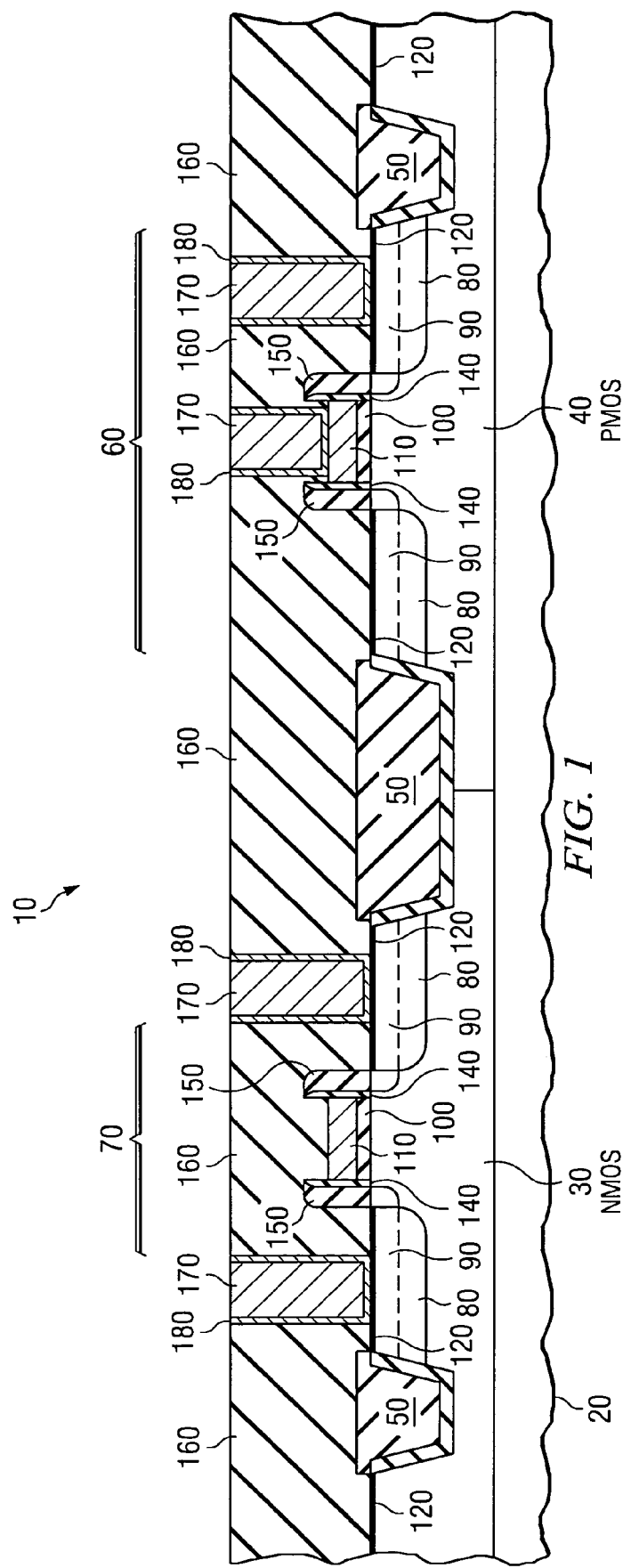
FIG. 1 is a cross-sectional view of a semiconductor structure in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a semiconductor wafer 10 in accordance with the present invention. In the example application, CMOS transistors 60, 70 are formed within a semiconductor substrate 20 having an NMOS region 30 and a PMOS region 40. However, it is within the scope of the invention to fabricate a semiconductor wafer 10 that contains any one of a variety of semiconductor devices, such as a bipolar junction transistors, capacitors, or diodes.

The CMOS transistors 60, 70 are electrically insulated from other active devices (not shown) by shallow trench isolation structures 50 formed within the semiconductor substrate 30, 40; however, any conventional isolation structure may be used such as field oxide regions or implanted isolation regions. The semiconductor substrate 20 is any semiconducting material that is doped with n-type and p-type dopants.

Transistors, such as CMOS transistors 60, 70, are generally comprised of a gate, source, and drain. More specifically, as shown in FIG. 1, the active portion of the transistors are comprised of sources/drains 80, source/drain extensions 90, and a gate that is comprised of a gate dielectric 100 and gate electrode 110.

The example PMOS transistor 60 is a p-channel MOS transistor. Therefore it is formed within a n-well region 40 of the semiconductor substrate 20. In addition, the deep sources and drains 80 and the source and drain extensions 90 have p-type dopants such as boron. The sources/drains 80 are usually heavily doped. However, the source/drain extensions 90 may be lightly doped ("LDD"), medium doped ("MDD"), or highly doped ("HDD"). The PMOS gate is created from a p-type doped polysilicon electrode 110 and gate oxide dielectric 100.

Similarly, the example NMOS transistor 70 is a n-channel MOS transistor. Therefore it is formed within a p-well region 30 of the semiconductor substrate 20. In addition, the deep sources and drains 80 and the source and drain extensions 90 have n-type dopants such as arsenic, phosphorous, antimony, or a combination of n-type dopants. The sources/drains 80 of NMOS transistor 70 are also heavily doped. However, the source/drain extensions 90 may be either LDD, MDD, or HDD. The NMOS gate 70 is created from an n-type doped polysilicon electrode 110 and gate oxide dielectric 100.

An offset structure comprising extension sidewalls 140 and spacer sidewalls 150 are used during fabrication to enable the proper placement of the source/drain extensions 90 and the sources/drains 80, respectively. More specifically, the source/drain extensions 90 are usually formed using the gate stack and extension sidewalls 140 as a mask. In addition, the sources/drains 80 are usually formed with the gate stack and spacer sidewalls 150 as a mask.

The top portion of the extension sidewalls 140 and the spacer sidewalls 150 are at the same level as—or extend past—the top surface of the gate electrode 110 in accordance with the invention. As described more fully below, this structure helps protect the polysilicon gate electrode from unwanted silicidation during the fabrication process step of source/drain silicidation.

In this example application, the sources/drains 80 have a layer of silicide 120 that is formed within the top surface of the sources/drains 80 during the fabrication process (as described below). The silicide layer 120 formed within the top surface of the sources/drains 80 is preferably $CoSi_2$; however, it is within the scope of the invention to fabricate the silicide 120 with other metals (such as nickel, platinum, titanium, tantalum, molybdenum, tungsten, or alloys of these metals). In addition, the silicide layer 120 formed on the top surface of the sources/drains 80 may be a self-aligned silicide (i.e. a "salicide")

Moreover, the gate electrode 110 is also silicided during the semiconductor fabrication process (as also described below). Preferably, the gate is fully silicided ("FUSI"); however, it is within the scope of the invention to form the silicide within only a portion of the gate electrode. FUSI gate electrodes have the advantage of low resistance and no poly depletion in comparison to polycrystalline silicon (i.e. "polysilicon" or "poly") gate electrodes. The purpose of the silicide formed within the gate electrode 110 and the top portion of the sources/drains 80 is the reduction of the contact resistance between the transistors 60,70 and the electrical contacts 170, 180. The gate electrode silicide is preferably comprised of NiSi; however, other metals may be used, such as cobalt, platinum, titanium, tantalum, molybdenum, tungsten, or an alloy.

Referring again to FIG. 1, a layer of dielectric insulation 160 surrounds the transistors 60, 70. The composition of dielectric insulation 160 may be any suitable material such as $SiO_2$ or organosilicate glass ("OSG"). The dielectric material 160 electrically insulates the metal contacts 170 that electrically connect the CMOS transistors 60, 70 that are shown in FIG. 1 to other active or passive devices (not shown) that are located throughout the semiconductor wafer 20. An optional dielectric liner (not shown) may be formed before the placement of the dielectric insulation layer 160. If used, the dielectric liner may be any suitable material such as silicon nitride.

In this example application, the contacts 170 are comprised of W; however, any suitable material (such as Cu, Ti, Al, or an alloy) may be used. In addition, an optional liner material 180 such as Ti, TiN, or Ta (or any combination or layer stack thereof) may be used to reduce the contact resistance at the interface between the liner 180 and the silicided regions of the gate electrode 110 and sources/drains 80.

Subsequent fabrication will create the "back-end" portion of the integrated circuit (not shown). The back-end generally contains one or more interconnect layers (and possibly via layers) that properly route electrical signals and power though out the completed integrated circuit.

Figure 2A:
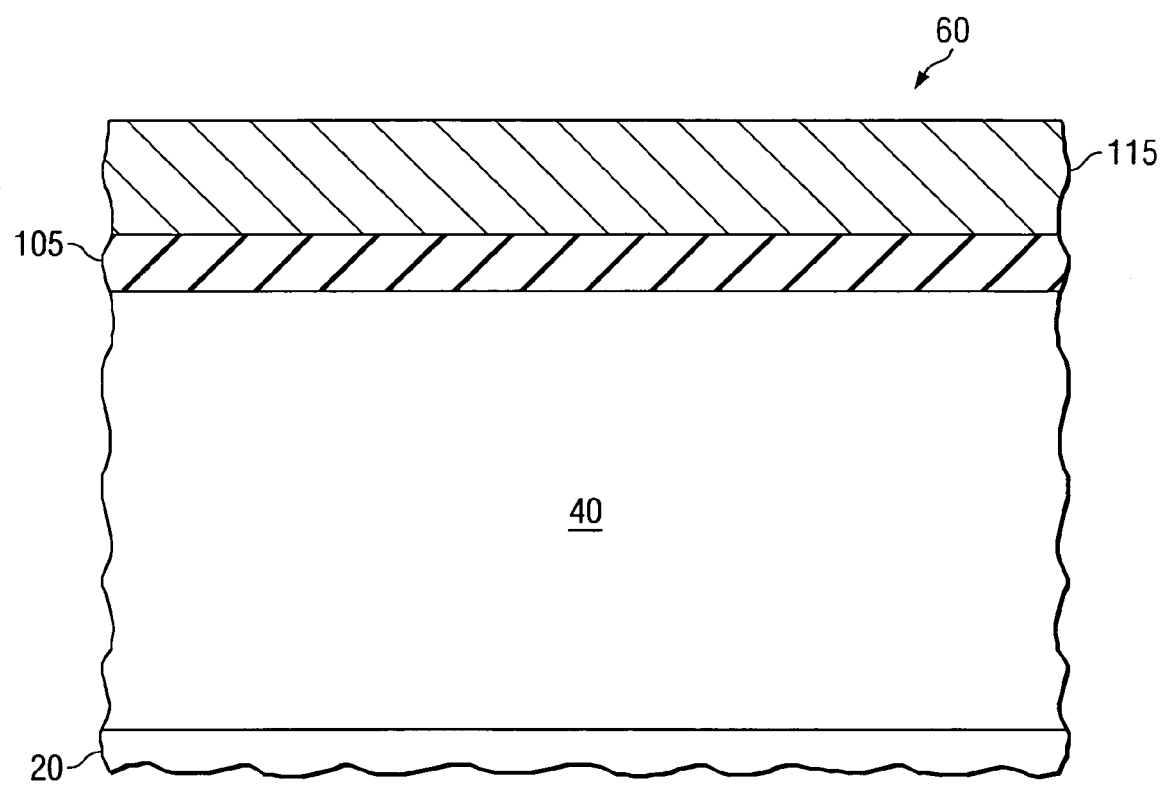
FIGS. 2A-2O are cross-sectional diagrams of a process for forming a transistor in accordance with the present invention.
Figure 2B:
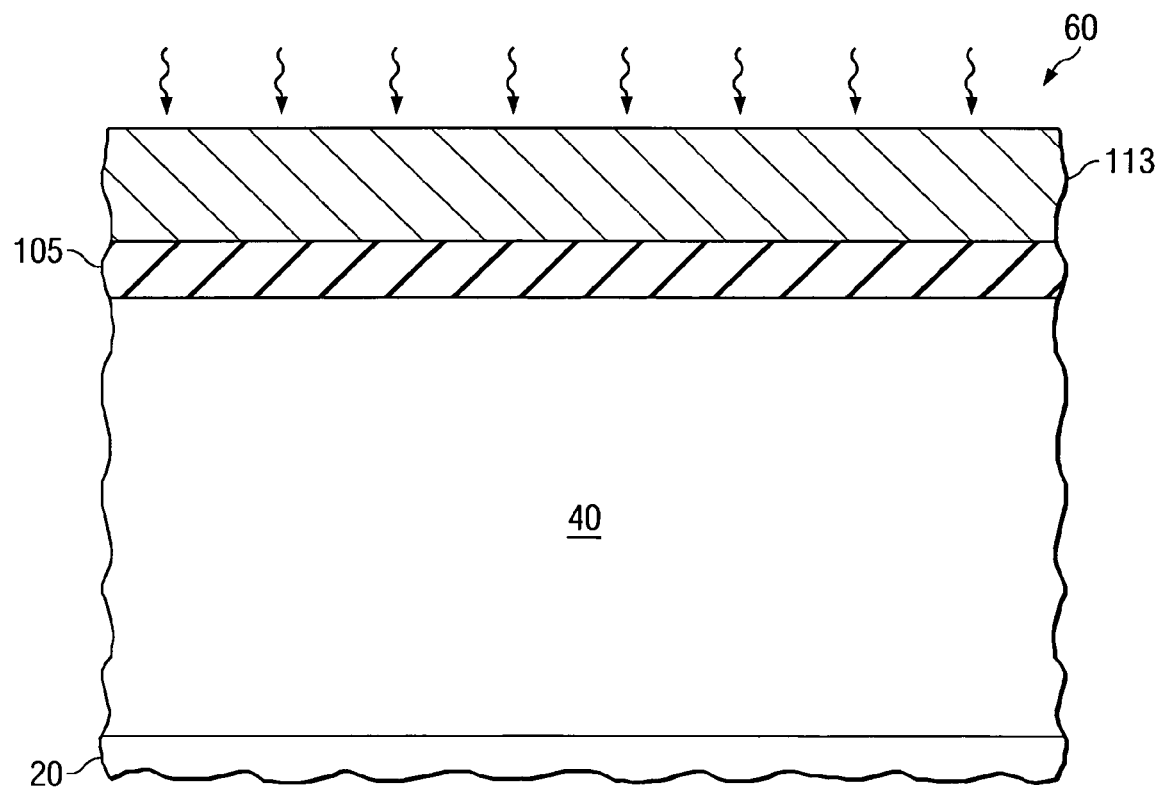
Figure 2C:
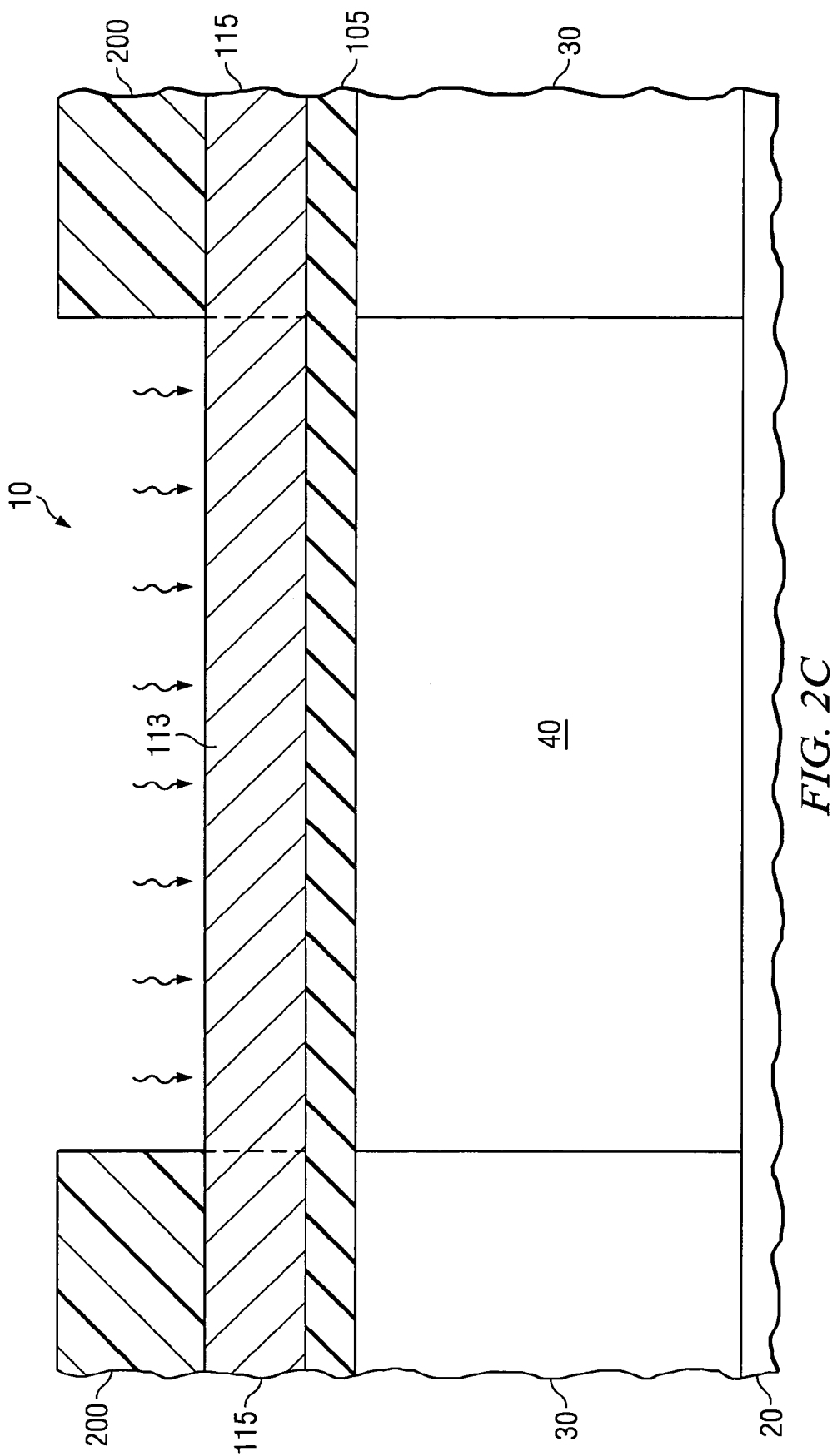
Figure 2D:
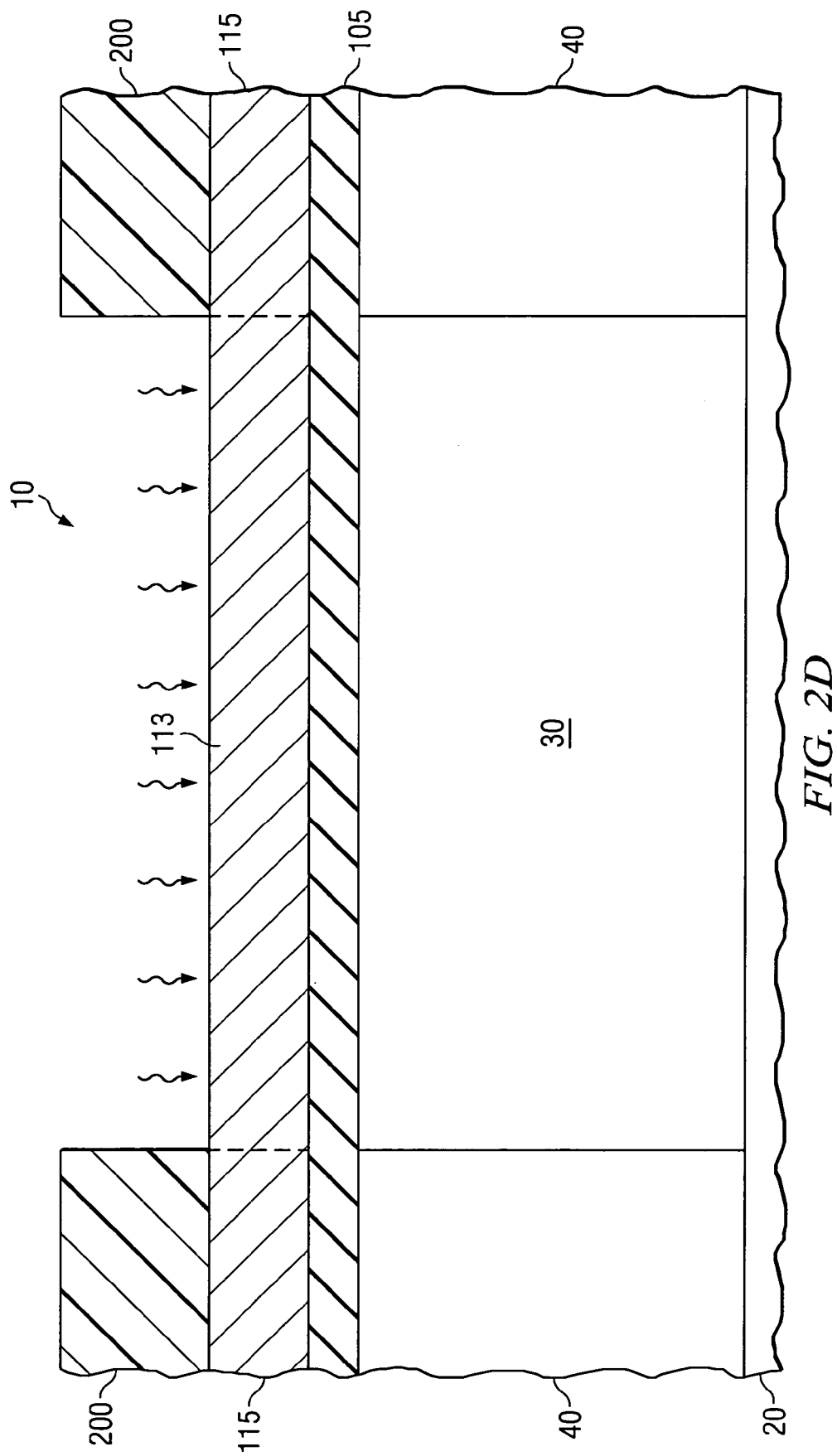
Figure 2E:
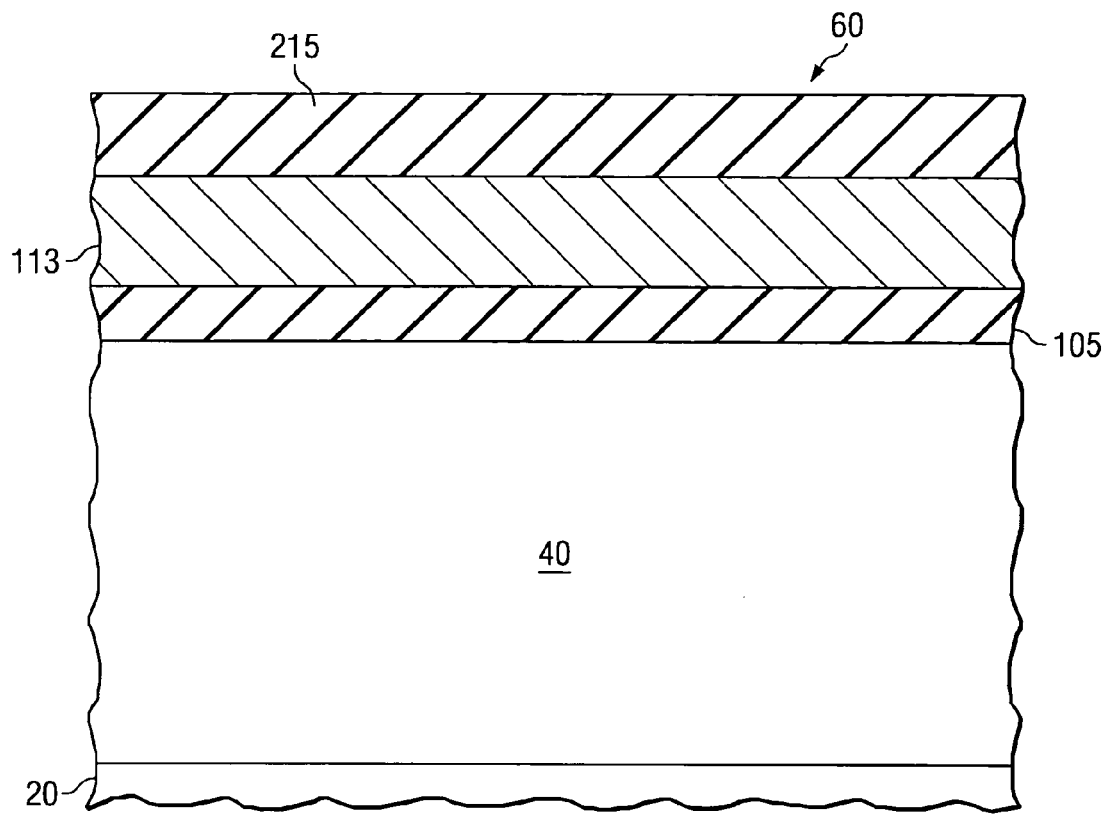
Figure 2F:
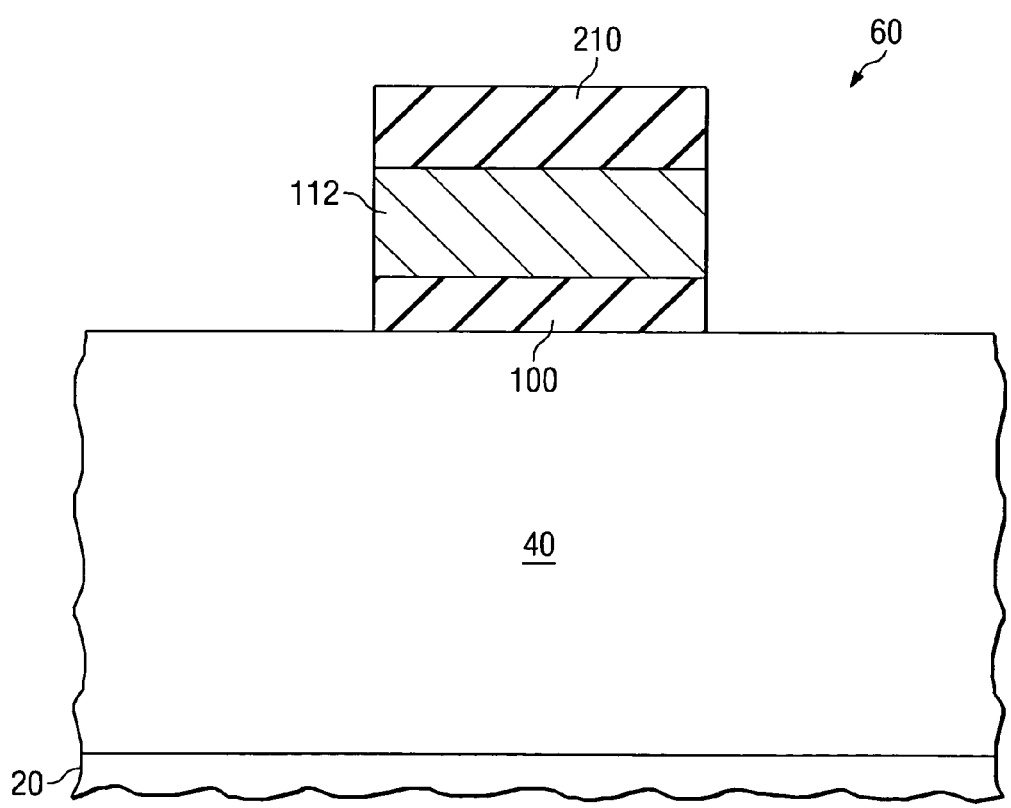
Figure 2G:
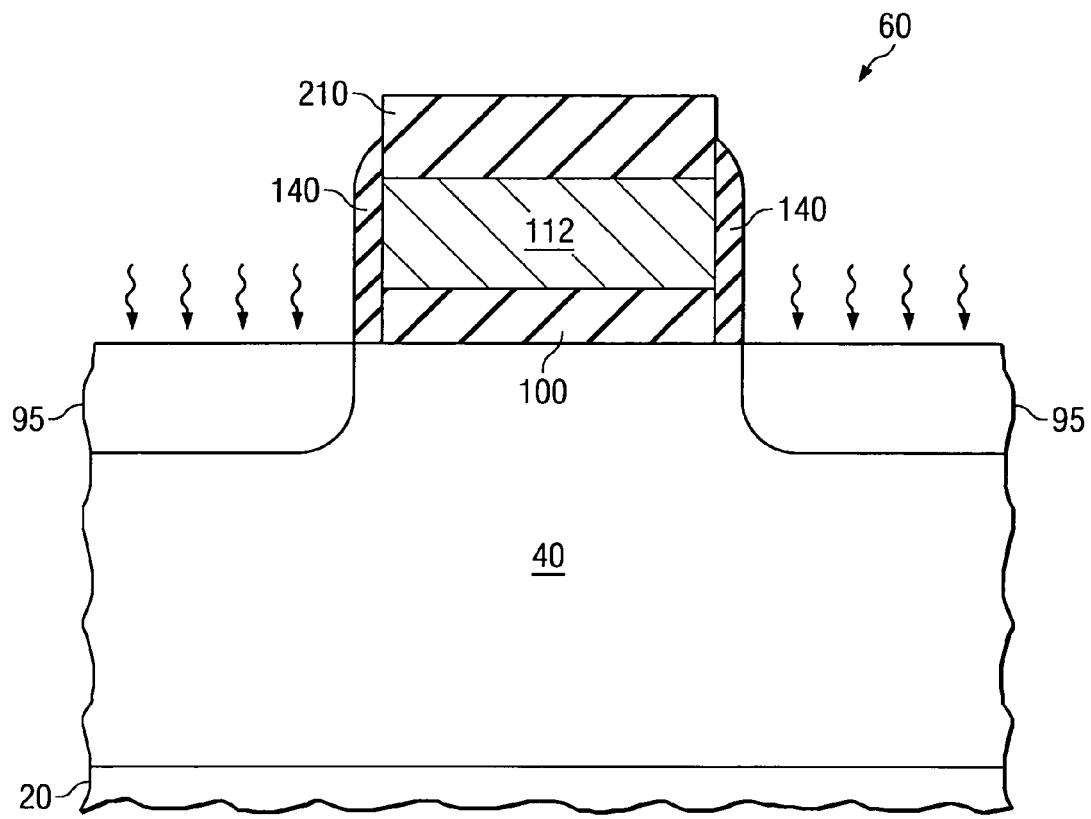
Figure 2H:
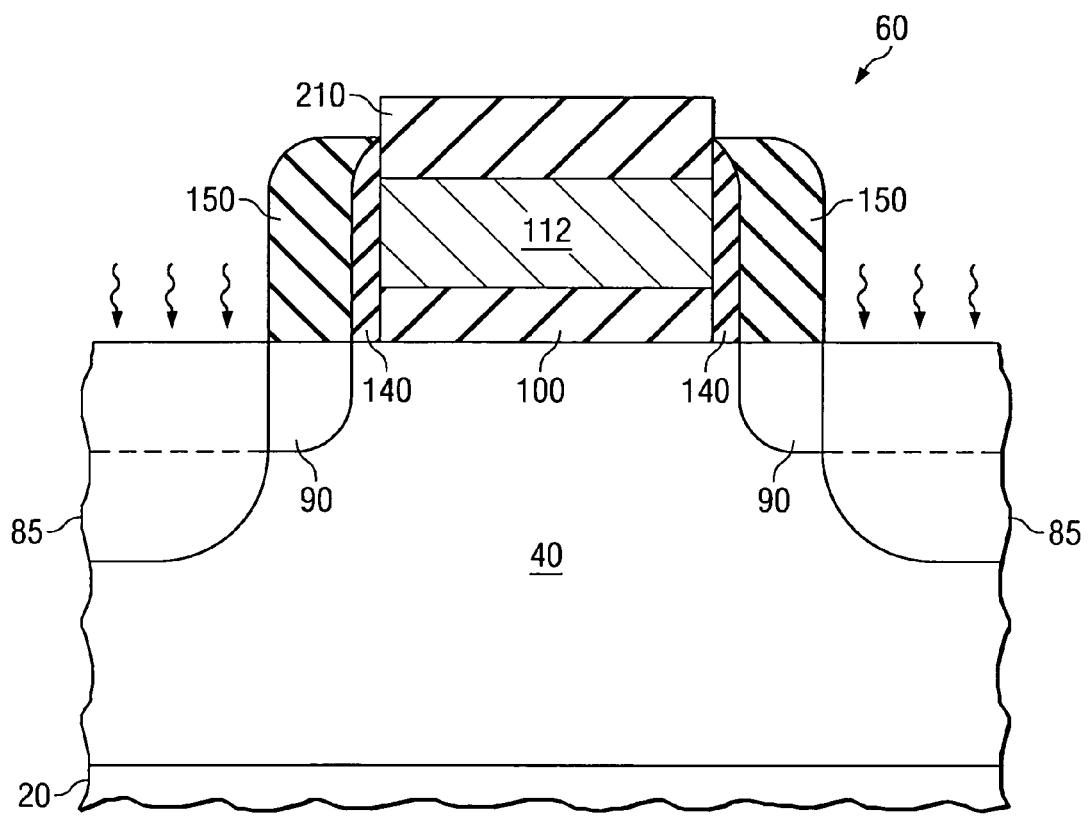
Figure 2I:
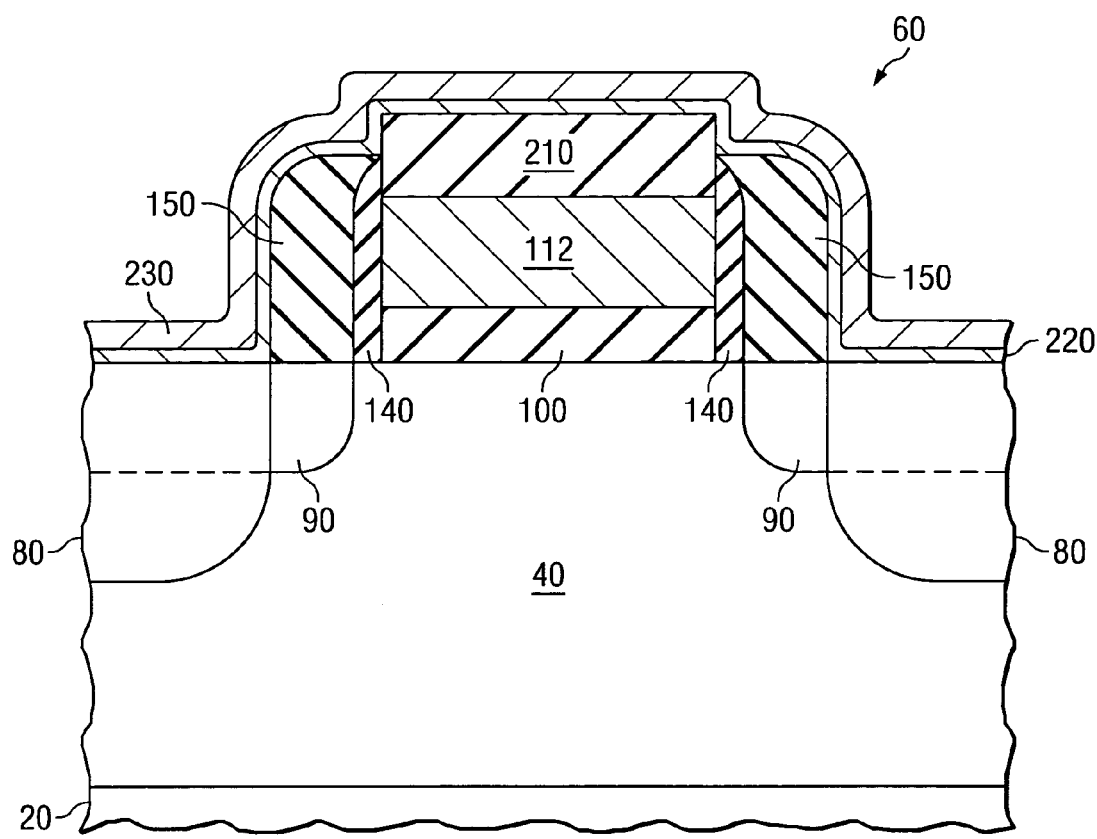
Figure 2J:
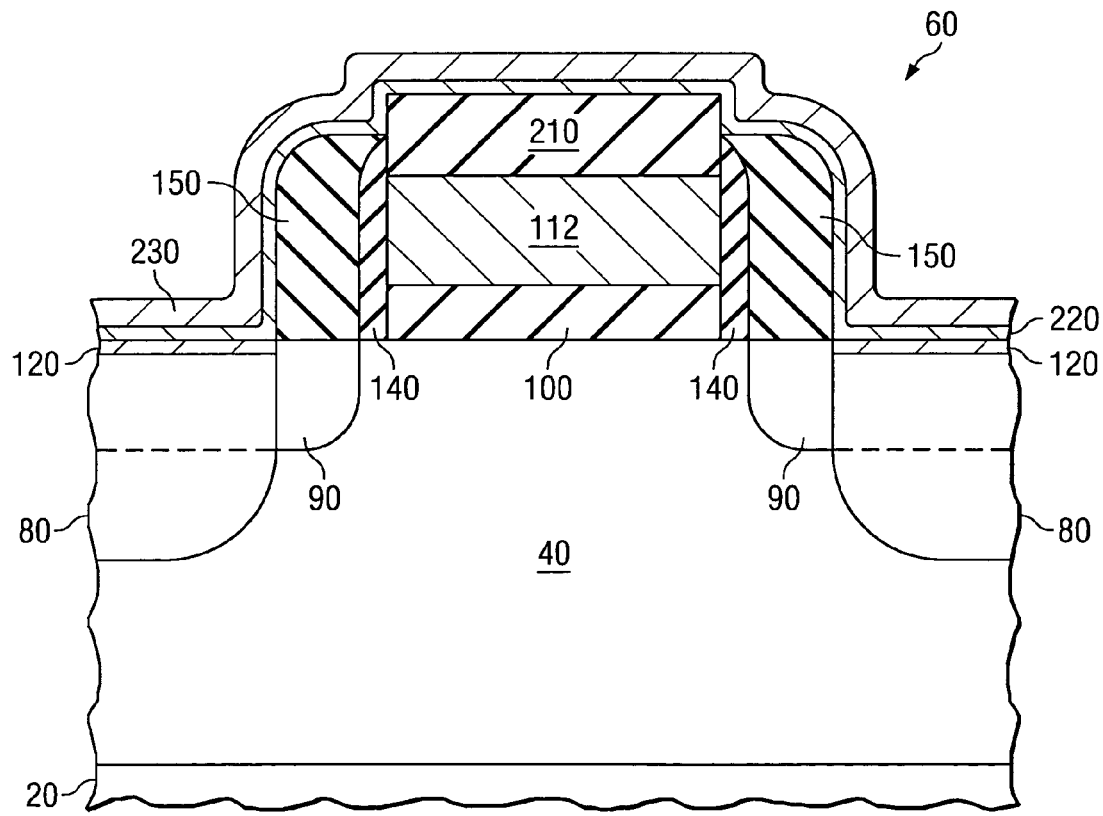
Figure 2K:
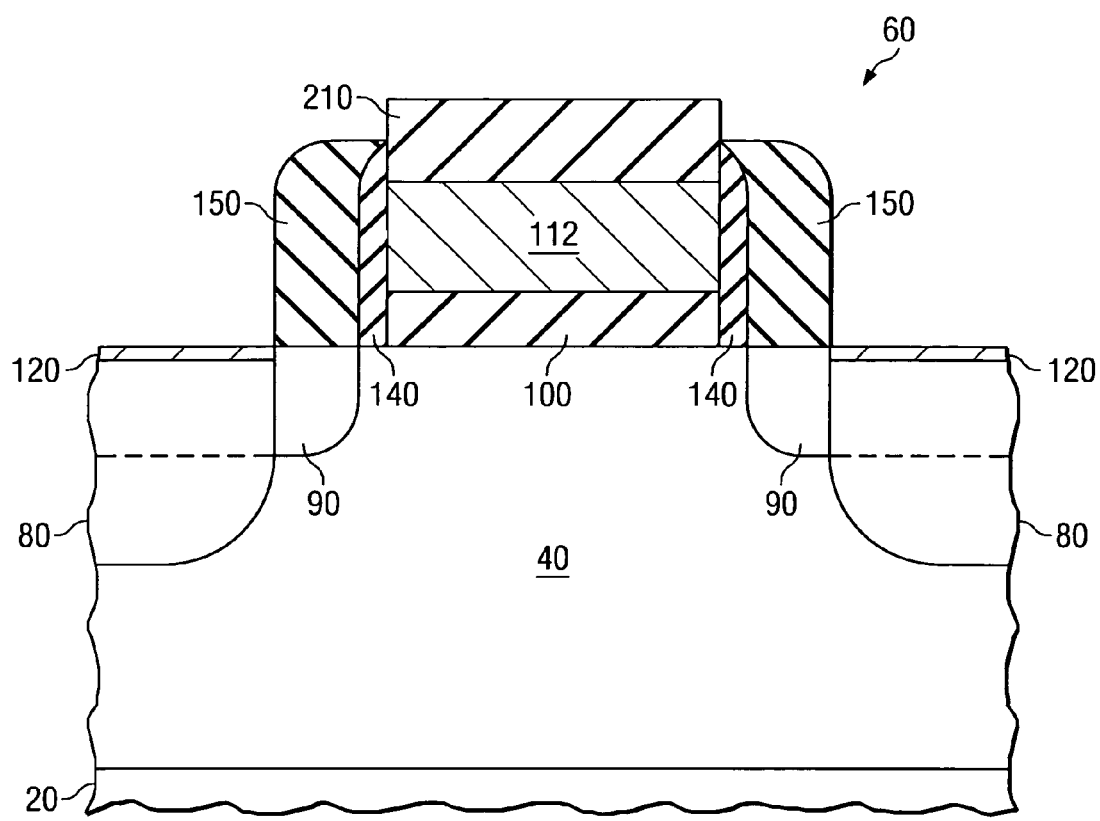
Figure 2L:
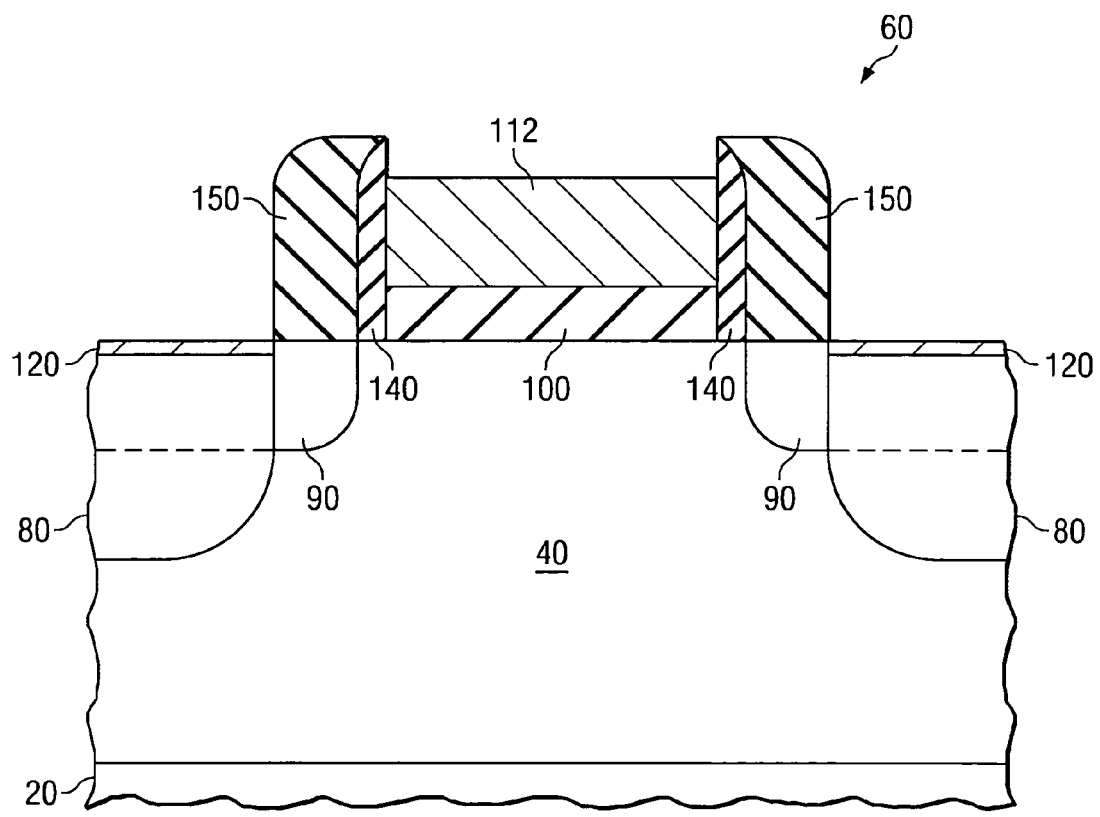
Figure 2M:
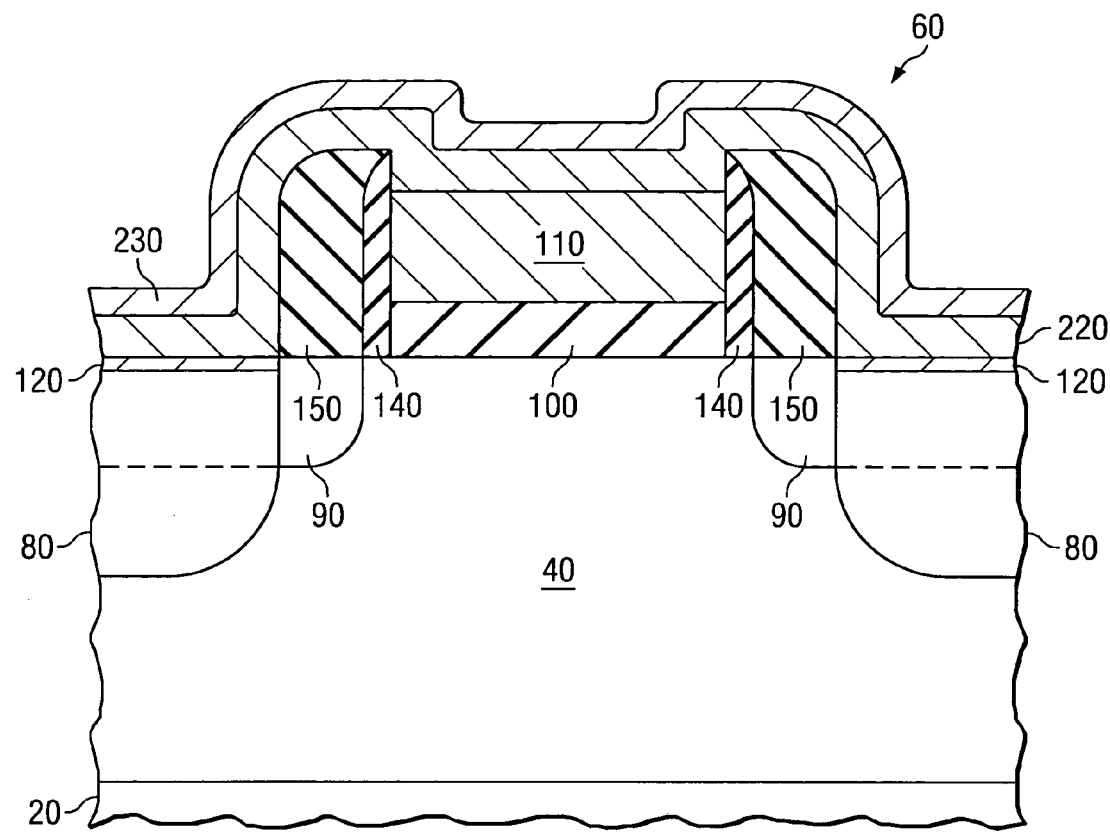
Figure 2N:
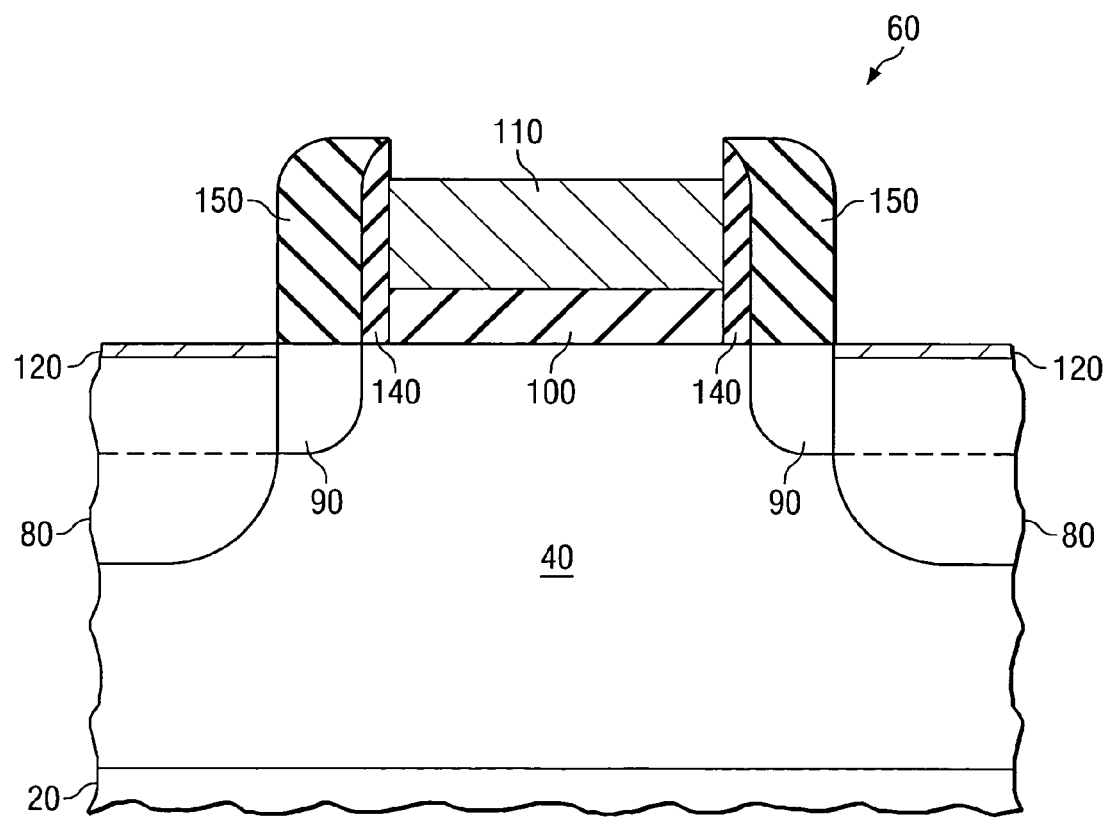

Referring again to the drawings, FIGS. 2A-2N are cross-sectional views of a partially fabricated semiconductor wafer 10 illustrating a process for forming an example PMOS transistor 60 in accordance with the present invention. Those skilled in the art of semiconductor fabrication will easily understand how to modify this process to manufacture other types of transistors (such as a NMOS transistor 70) in accordance with this invention.

FIG. 2A is a cross-sectional view of a transistor structure 60 after the formation of the gate oxide layer 105 and the gate polysilicon layer 115 on the top surface of a semiconductor substrate 20. In the example application, the semiconductor substrate 20 is silicon; however any suitable material such as germanium or gallium arsenide may be used. The example PMOS transistor 60 is formed within a n-well region 40 of the semiconductor substrate 20.

The gate oxide layer 105 and the gate polysilicon layer 115 are formed using well-known manufacturing techniques. A first layer formed over the surface of the semiconductor substrate 20 is a gate oxide layer 105. As an example, the gate oxide layer 105 is silicon dioxide formed with a thermal oxidation process. However, the gate oxide layer 105 may be any suitable material, such as nitrided silicon oxide, silicon nitride, or a high-k gate dielectric material, and may be formed using any one of a variety of processes such as an oxidation process, thermal nitridation, plasma nitridation, physical vapor deposition ("PVD"), or chemical vapor deposition ("CVD").

A gate polysilicon layer 115 is then formed on the surface of the gate oxide layer 105. The gate polysilicon layer 115 is comprised of polycrystalline silicon in the example application. However, it is within the scope of the invention to use other materials such as an amorphous silicon, a silicon alloy (e.g. SiGe), or other suitable materials. The gate polysilicon layer 115 may be formed using any process technique such as CVD or PVD.

In accordance with the best mode of the invention, an ion implantation is performed after the formation of the gate polysilicon layer 115. In the example application shown in FIG. 2B, the semiconductor wafer 10 is initially subjected to a blanket ion implantation of a p-type dopant, preferably boron. This implantation process will move the work function of the gate electrode of the PMOS transistors higher. Therefore, by using ion implantation at this point in the fabrication process the work function of the PMOS transistor may be customized to the desired level-independent of the dopant level used later in the fabrication process to form the source/drain extension junctions.

Any suitable machine may be used to perform the ion implant such as the xRLeapII or the xRLeapQ (made by Applied Materials), the GSD Ultra or the GSD HC E$^2$ (made by Axcelis Technologies), or the VIISTA80 (made by Varian Semiconductor Equipment). The implant angle is 0-10°; however, 0° is preferred. The implant energy and dose depends on the dopant species, the thickness of the gate electrode layer, and the threshold voltage required for the devices. It is to be noted that this ion implant may be followed by a standard post ion implantation clean.

In another embodiment, shown in FIG. 2C, patterned photoresist 200 is used to cover the NMOS regions during the ion implantation of the p-type dopants. Once the implantation process is complete the photoresist 200 is removed (with a standard ashing and cleaning process). If this alternative process flow is used then the resulting PMOS regions 40 will be similar to the structure shown in FIG. 2B.

Next, the semiconductor wafer 10 is subjected to an n-type ion implantation process (for NMOS regions). As shown in FIG. 2D, a layer of photoresist 200 is formed and patterned to expose the NMOS regions 30. The n-type dopant is preferably phosphorous. However, other n-type dopants or combinations of n-type dopants may be used; such as arsenic, antimony, or a combination of n-type dopants. This implantation process will move the work function of the gate electrodes of the NMOS transistors lower. Like the p-type ion implant process described above, this n-type implantation process is preferably used to customize the work function of the gate electrodes of the NMOS transistors-independent of the source/drain extension implant parameters.

Referring again to the fabrication of the example PMOS transistor 60, the next step in the example application is the formation of a protection layer 215 over the entire semiconductor wafer, as shown in FIG. 2E. Preferably, the protection layer is formed using a CVD process; however, any suitable process may be used. In the best mode application, the protection layer is comprised of a silicon oxide layer (having a thickness between 0.5-10 nm) and a silicon nitride layer (having a thickness between 20-70 nm). The purpose of the silicon oxide layer is to serve as a buffer for better process control, as described more fully in the commonly assigned patent application having patent application Ser. No. 11/007, 569 and incorporated herein by reference but not admitted to be prior art with respect to the present invention by its mention in this section. It is to be noted that the silicon nitride layer is the main component of the protection layer 215.

Alternatively, the protection layer 215 may be comprised of $Si_xN_y$, SiC, other metal nitrides, or combinations and stacks thereof. More specifically, the protection layer 215 may be $Si_3N_4$, or a stack consisting of $SiO_2/Si_3N_4/SiO_2$. In the example application the protection layer 215 is at least 20 nm thick in order to control the height of the sidewalls 140, 150 and thereby protect the doped gate polysilicon layer 113 during the silicidation process (described below). Preferably, the protection layer 215 is between 30-50 nm thick. In the example application the protection silicon nitride layer 215 is deposited by a rapid thermal CVD process using silane or dichlorosilane and ammonia precursors.

After a pattern and etch process, a gate stack having a gate dielectric 100, a gate electrode 112, and gate protection layer 210 will be formed from the gate oxide layer 105, the doped gate polysilicon layer 113, and the protection layer 215 respectively. This gate stack, shown in FIG. 2F, may be created through a variety of processes. For example, the gate stack may be created by forming a layer of photoresist over the semiconductor wafer, patterning the photoresist, and then using the photoresist pattern to etch the gate oxide layer 105, the doped gate polysilicon layer 113, and the protection layer 215. This gate stack may be etched using a suitable etch process, such as an anisotropic etch using plasma or reactive ions.

The fabrication of the PMOS transistor 60 now continues with standard process steps. Generally, the next step in the fabrication of the PMOS transistor 60 is the formation of the extension regions 95 using the extension sidewalls 140 as a template.

As shown in FIG. 2G, extension sidewalls 140 are formed on the outer surface of the gate stack using any suitable processes and materials. The extension sidewalls 140 may be formed from a single material or may be formed from more than one layer of materials. For example, the extension sidewalls 140 may be comprised of an oxide, oxi-nitride, silicon dioxide, nitride, or any other dielectric material or layers of dielectric materials. The material layers for the extension sidewalls 140 may be formed with any suitable process, such as thermal oxidation, or deposition by ALD, CVD, or PVD. Preferably, at least one layer of the extension sidewall 140 is comprised of a silicon nitride that is formed with a CVD process that uses a bis-t-butylaminosilane ("BTBAS") precursor. Forming the silicon nitride layer with that precursor will help guard against the etching of the extension sidewalls 140 during the process of removing the gate protection layer later in the fabrication process (due to the low etch rate of BTBAS in the etching solution that is used for the protection layer removal). It is to be noted that the anisotropic etch process that is used to shape the material layer or layers into the extension sidewalls 140 will cause the highest point of the extension sidewalls 140 to be recessed from the top surface of the gate protection layer 210, as shown in FIG. 2G.

These extension sidewalls 140 are now used as a template to facilitate the proper doping of the extension regions 95. However, it is within the scope of the invention to form the extension regions 95 at any point in the manufacturing process.

The extension regions 95 are formed near the top surface of the semiconductor substrate 40 using any standard process. For example, the extension regions 95 may be formed by low-energy ion implantation, a gas phase diffusion, or a solid phase diffusion. The dopants used to create the extension regions 95 for a PMOS transistor 120 are p-type (i.e. boron). The dopants used to create the extension regions 95 for a NMOS transistor 70 are n-type (i.e. phosphorous or arsenic). However, other dopants or combinations of dopants may be used.

In the example application shown in FIG. 2G, the extension sidewalls 140 are used to direct the dopant implantation to the proper location 95 within the semiconductor substrate 40. Due to lateral straggling of the implanted species, the extension regions 95 initiate from points in the semiconductor substrate 40 that are slightly inside the outer corner of the extension sidewalls 140.

At some point after the implantation of the extension regions 95, the extension regions 95 are activated by an anneal process (performed now or later) to form source/drain extensions 90 (as shown in FIG. 2H). This anneal step may be performed with any suitable process such as rapid thermal anneal ("RTA"). The annealing process will likely cause a lateral migration of each extension region toward the opposing extension region.

Referring to FIG. 2H, spacer sidewalls 150 are now formed proximate to the extension sidewalls 140. The spacer sidewalls 150 may be formed using any standard process and materials. In addition the spacer sidewalls 150 may be formed from a single material or from two or more layers of materials. For example, the spacer sidewalls 150 may be comprised of a cap oxide and a silicon nitride layer that are formed with a CVD process and subsequently anisotropically etched (preferably using standard anisotropic plasma etch processes). However, it is within the scope of the invention to use more layers (i.e. a spacer oxide layer, a silicon layer, and a final oxide layer) or less layers (i.e. just a silicon oxide layer or a silicon nitride layer) to create the spacer sidewalls 150. It is to be noted that the semiconductor wafer 10 is usually subjected to a standard post-etch cleaning process after the formation of the spacer sidewalls 150. It is also to be noted that the height of the extension sidewalls 140 and the spacer sidewalls 150 at this point (FIG. 2H) is lower than the previous height of the extension sidewalls (FIG. 2G) due to the additional anisotropic etching process.

Now the source/drain sidewalls 150 are used as a template for the implantation of dopants into the source/drain regions 85. However, it is within the scope of the invention to form the source/drain regions 85 at another point in the manufacturing process.

The source/drain regions 85 may be formed through any one of a variety of processes, such as deep ion implantation or deep diffusion. The dopants used to create the source/drain regions 85 for a PMOS transistor are typically boron; however, other dopants or combinations for dopants may be used. The dopants used to create the source/drain regions 85 for a NMOS transistor are typically phosphorous or arsenic; however, other dopants or combinations for dopants may be used.

The implantation of the dopants is self-aligned with respect to the outer edges of the source/drain sidewalls 150. However, it is to be noted that due to lateral straggling of the implanted species, the source/drain regions 85 initiate slightly inside the outer corner of the spacer sidewalls 150.

In the example application, the source/drain regions 85 are activated by a second anneal step to create sources/drains 80. (However, the extension region anneal and the source/drain region anneal may be combined and performed at this point in the fabrication process.) This anneal step acts to repair the damage to the semiconductor wafer and to activate the dopants. The activation anneal may be performed by any technique such as RTA, flash lamp annealing ("FLA"), or laser annealing. This anneal step often causes lateral and vertical migration of dopants in the source/drain extensions 90 and the sources/drains 80. In addition, this anneal step will cause the recrystallization of the ion implant areas 80, 90 (or the full crystallization of the ion implant areas 80, 90 if this is the first anneal).

As shown in FIG. 2I, a layer of silicidation metal 220 is now formed over the top surface of the semiconductor wafer 10. The silicidation metal layer 220 is preferably comprised of cobalt; however, other suitable materials such as nickel, platinum, titanium, tantalum, molybdenum, tungsten, or alloys may be used. In the example application, the silicidation metal layer 220 is between 4-10 nm thick and is formed using a PVD process.

An optional capping layer 230 may also be formed over the silicidation metal layer 220. If used, the capping layer 230 acts as a passivation layer that prevents the diffusion of oxygen from ambient into the silicidation metal layer 220. The capping layer may be any suitable material, such as TiN. In the example application, the capping layer 230 is between 5-30 nm thick.

In accordance with the invention, the semiconductor wafer is now annealed with any suitable process, such as RTA. In the example application, the silicide anneal is performed for 10-60 seconds at a temperature between 400-600° C.

This anneal process will cause a silicide 120 (i.e. a Co-rich silicide or Co mono-silicide) to form at the surface of the sources/drains 80 as shown in FIG. 2J. It is to be noted that the silicidation metal layer 220 will only react with the active substrate (i.e. exposed Si); namely, the sources/drains 80 and the exposed surfaces of Si (such as the areas for diodes). Therefore, the silicide 120 formed by the annealing process is a salicide. It is important to note that the gate electrode 112 was not modified by the anneal process because the gate electrode 112 was protected by the gate protection layer 210 and the extension sidewalls 140 (which overlap the gate protection layer 210).

The next step is the removal of the un-reacted portions of the silicidaton metal layer 220, as shown in FIG. 2K. The silicidaton metal layer 220 (and the capping layer 230, if used) is removed with any suitable process such as a wet etch process (e.g. using a fluid mixture of sulfuric acid, hydrogen peroxide, and water).

It is within the scope of the invention to perform another silicide anneal (such as a RTA) at this point in the manufacturing process in order to further react the silicide 120 with the sources/drains 80. In the example application, a second silicide anneal is performed for 10-60 seconds at a temperature between 650-800° C. If the initial anneal process did not complete the silicidation process, this second anneal will ensure the formation of a mono-silicide CoSi, which lowers the sheet resistance of the silicide 120.

The gate protection layer 210 is now removed, as shown in FIG. 2L. The gate protection layer 210 may be removed by any suitable process such as a wet etch using a solution containing phosphoric acid at elevated temperatures in the range of 100-600° C. Alternatively, the protection layer can be removed by using a dilute HF solution at elevated temperatures. Because the extension sidewalls 140 and the spacer sidewalls 150 were formed with the gate protection layer 210 in place over the gate electrode 112, the extension sidewall and the spacer sidewall structures 140,150 will now stretch beyond the top surface of the gate electrode 112. With the gate protection layer 210 removed, the gate electrode 112 is now exposed and therefore available for gate electrode silicidation.

As shown in FIG. 2M, a second layer of silicidation metal 220 is now formed over the top surface of the semiconductor wafer 10. The silicidation metal layer 220 is preferably comprised of nickel; however, other suitable materials such as cobalt, platinum, titanium, tantalum, molybdenum, tungsten, or an alloy may be used. Preferably, the silicidation metal 220 is designed to fully silicidize the polysilicon electrode 250. As it takes approximately 1 nm of nickel to fully silicidize approximately 1.8 nm of polysilicon, the thickness of the silicidation metal 220 should be at least 56% of the thickness of the polysilicon gate electrode 112. To be comfortable however, it is suggested that the thickness of the silicidation metal 220 should be at least 60% of the thickness of the polysilicon gate electrode 112. Thus, where the thickness of the polysilicon gate electrode 112 ranges from about 50 nm to about 150 nm, in the example application, the thickness of the silicidation metal 220 should range from approximately 30 nm to about 90 nm.

Figure 2O:
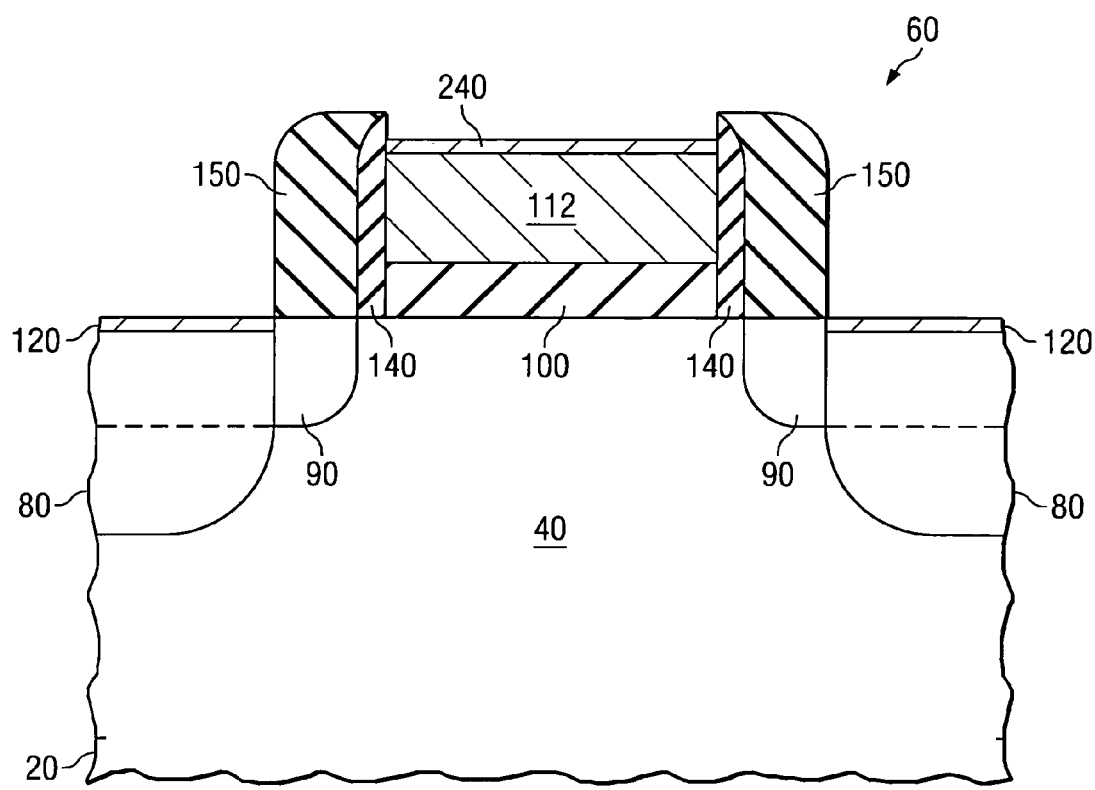

In an alternative embodiment of the invention, a thinner layer of silicidation metal 220 may be formed over the exposed portions of the polysilicon gate electrode 112 as well as over the remainder of the semiconductor device. In this instance, the thinner layer of silicidation metal 220 will only react with the top portion of the polysilicon gate electrode 112 to form a partially silicided gate electrode, as shown in FIG. 2O. The thickness of the thinner layer of silicidation metal 220 could range from about 3 nm to about 15 nm to only partially silicide the silicided gate electrode. This embodiment is particularly useful for applications where a poly-gate oxide interface is used, rather than a silicide-gate oxide interface, as is the case in the fully silicided gate electrode discussed directly above.

An optional capping layer 230 may also be formed over the silicidation metal layer 220. If used, the capping layer 230 acts as a passivation layer that prevents the diffusion of oxygen from ambient into the silicidation metal layer 220. The capping layer may be any suitable material, such as TiN or Ti. In the example application, the capping layer 230 is between 5-30 nm thick.

In accordance with the invention, the semiconductor wafer is now annealed with any suitable process, such as RTA. In the example application, the silicide anneal is performed for 10-60 seconds at a temperature between 300-500° C. In the example application, the gate electrode 110 is fully silicided ("FUSI"), as shown in FIG. 2M. Alternatively, as shown in FIG. 2O, an anneal process may form only a gate silicide film 240 (i.e. a nickel-rich silicide or nickel mono-silicide) at the top potion of the gate electrode 112. It is to be noted that the silicidation metal layer 220 will not react with the silicided sources/drains 80 and the silicided surfaces of the n-well 40 because they are protected from further silicidation by their previously formed silicide layer 120.

The next step is the removal of the un-reacted portions of the silicidaton metal layer 220, as shown in FIG. 2N. The silicidaton metal layer 220 (and the capping layer 230, if used) is removed with any suitable process such as a selective wet etch process (i.e. using a fluid mixture of sulfuric acid, hydrogen peroxide, and water).

It is within the scope of the invention to perform another silicide anneal (such as a RTA) at this point in the manufacturing process in order to further react the gate silicide. In the example application, the second silicide anneal is performed for 30-120 seconds at a temperature between 400-600° C. If the initial anneal process did not complete the silicidation process, this second anneal will ensure the formation of a NiSi having a lowered sheet resistance. As stated above, the gate electrode 110 is fully silicided ("FUSI") through the silicidation process in the example application.

It is to be noted that the work function of gate electrode 110 is modulated by the dopants that were implanted before the formation of the protection layer 210. The protection layer 210 also prevented the loss of dopants during the source/drain anneal process; thereby further controlling the tuning of the gate electrode work function during the fabrication of the semiconductor wafer 10.

Figure 3A:
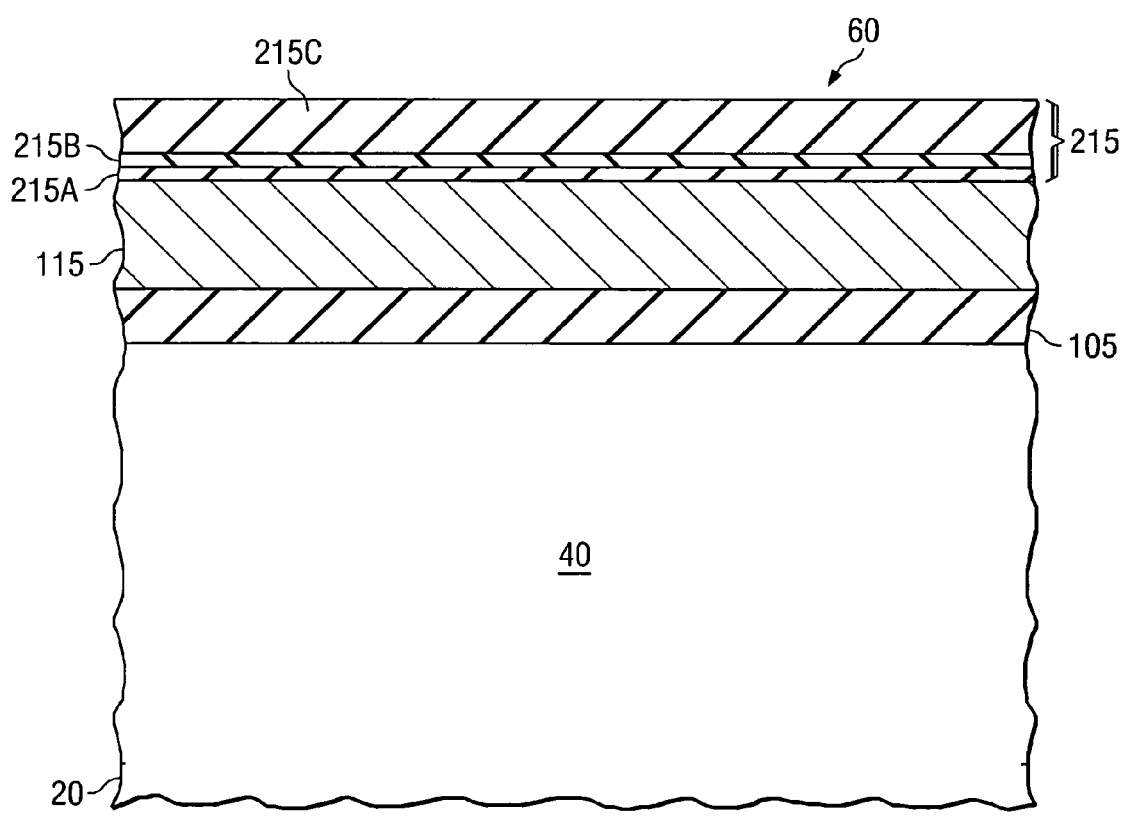
FIGS. 3A-3F are cross-sectional diagrams of a process for forming a transistor in accordance with the present invention with an alternate process flow.

One of the variations to the present invention is to form the extension sidewalls 140 and spacer sidewalls 150 with the protection layer 215 in place but then remove a portion of the protection layer 215 so that the gate polysilicon layer 115 receives dopants during the implantation of the source/drain regions 85 (for work function tuning of the gate electrode 110). With this alternative fabrication process, standard manufacturing steps (as described above) would be used to build the gate oxide layer 105 and gate polysilicon layer 115 of the example PMOS transistor 60, as shown in FIG. 3A.

The protection layer 215 of this alternative process flow is comprised of multiple layers in order to remove a portion of the protection layer 215 after the formation of the spacer sidewalls 150. In this example application the protection layer is comprised of a bottom layer of silicon nitride 21 5A (preferably 2-15 nm thick), a middle layer of silicon oxide 215B (preferably 2-10 nm thick), and a top layer of silicon nitride 215C (preferably 20-70 nm thick).

Figure 3B:
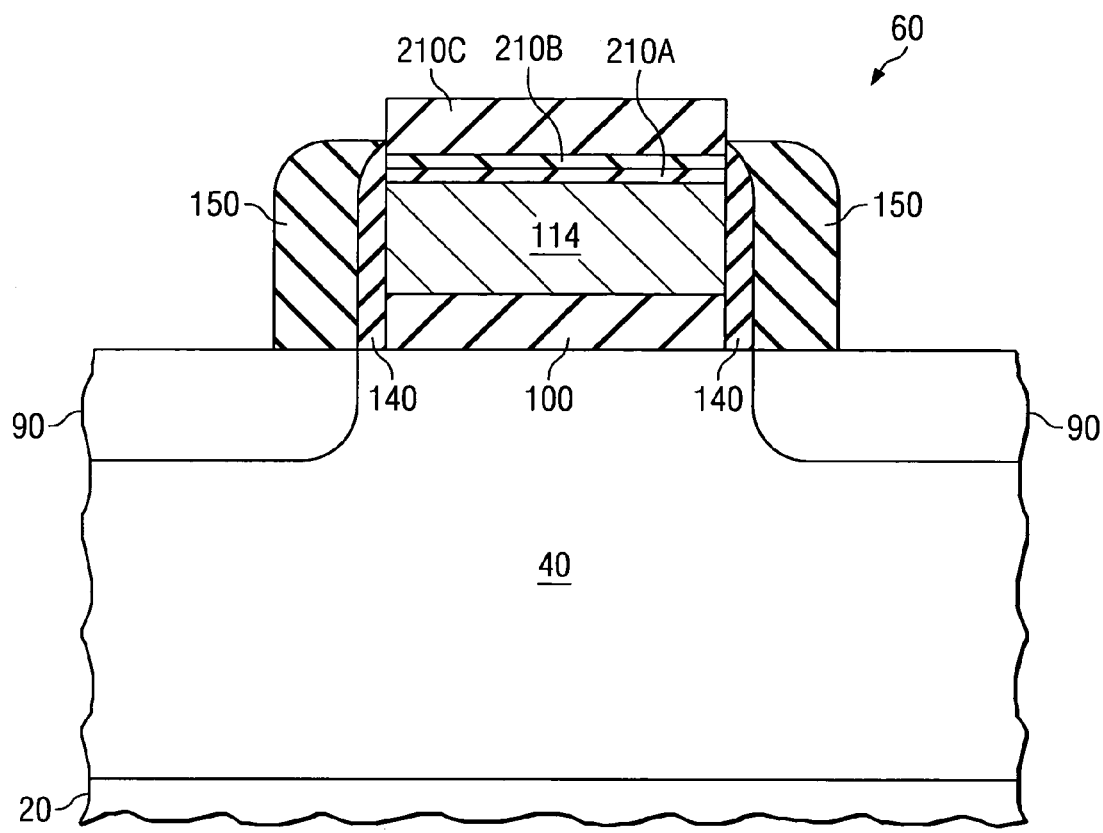

Next, the gate stack is formed using any suitable etch processes (as described above). The gate stack contains a gate dielectric 100, a gate electrode 114, and a three part gate protection layer 210, as shown in FIG. 3B. After the gate stack is formed, standard processes and materials are used to form the extension sidewalls 140, implant and anneal the source/drain extensions 90, and then form the spacer sidewalls 150.

Figure 3C:
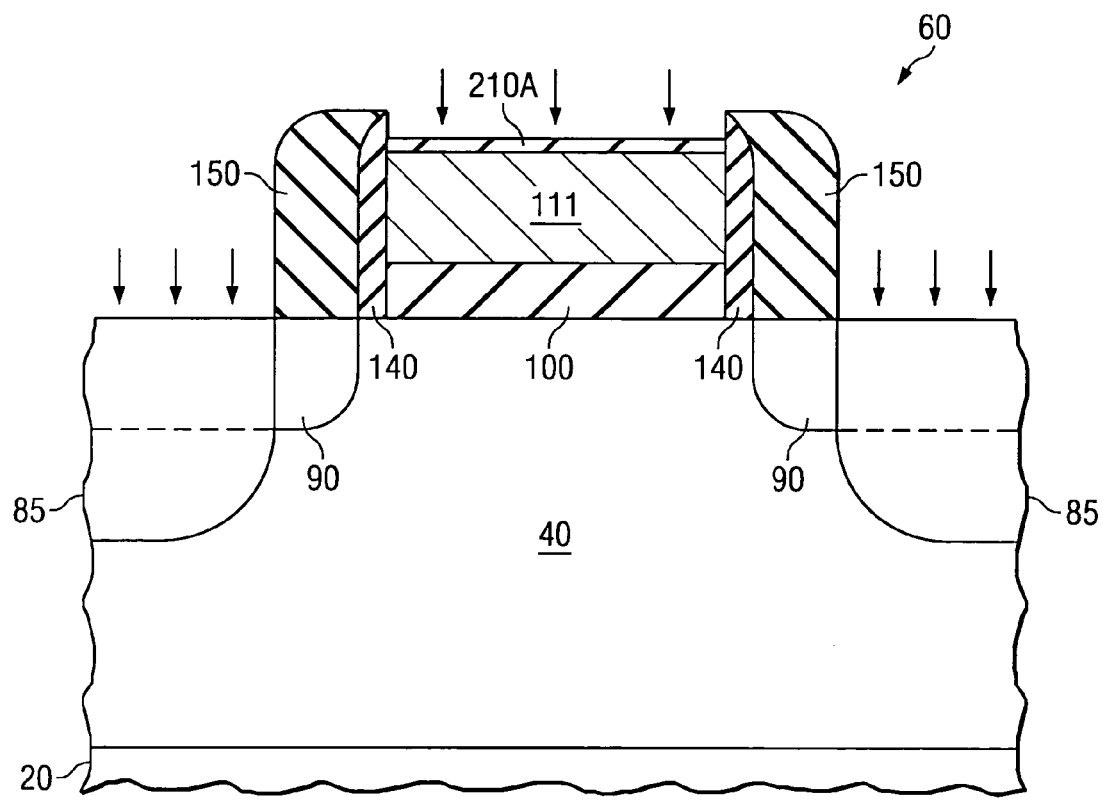

As shown in FIG. 3C, the top layer of silicon nitride 210C is then removed by hot phosphoric acid solution, which uses the middle layer 210B as an etch stop layer. The middle layer of silicon oxide 210B is now removed with a standard wet etch process such as dilute HF solution. Next, the semiconductor wafer 10 is subjected to the source/drain ion implantation process. Because of the reduced thickness of the protection layer 210, the dopants implanted into the source/drain regions 85 will also be implanted into the gate electrode 111; thereby tuning the work function of the final FUSI gate electrode 110.

Figure 3D:
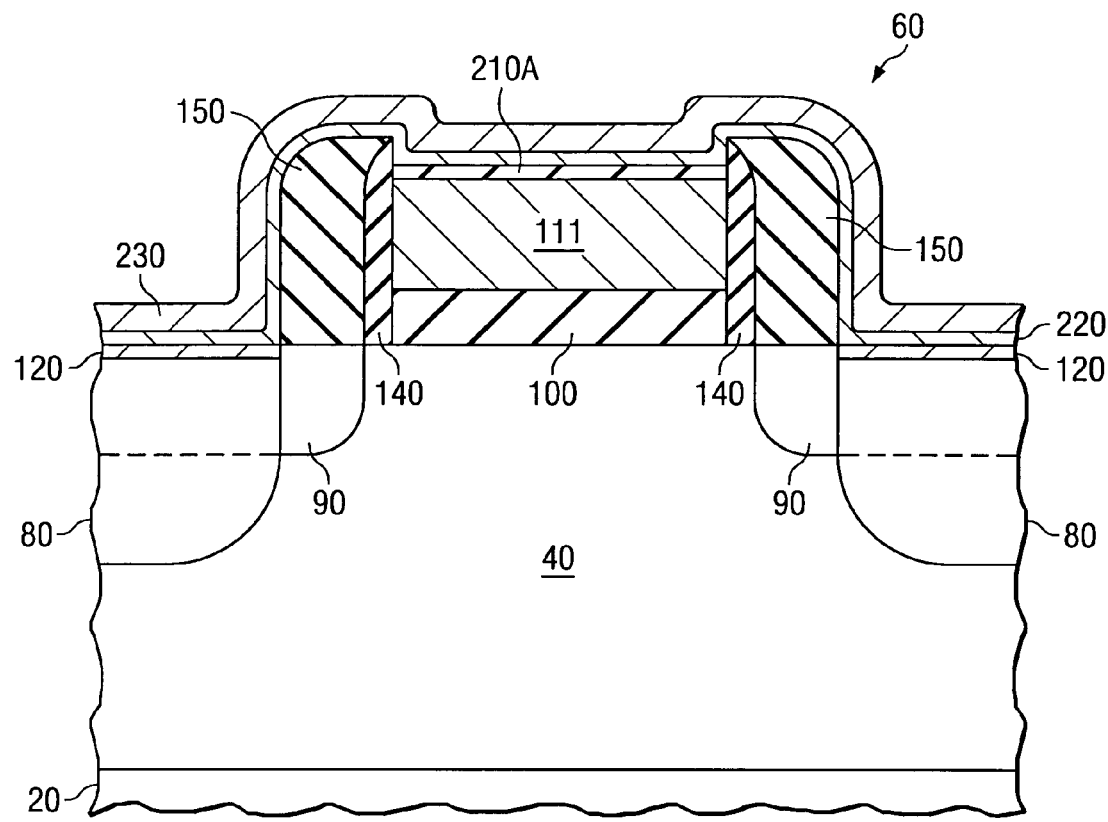

The semiconductor wafer 10 is now annealed, forming sources/drains 80, as shown in FIG. 3D. Using the processes describe above, a first layer of silicidation metal 220 and a capping layer 230 is formed over the semiconductor wafer 10 and then the wafer is annealed (using an RTA process) in order to form the source/drain silicide films 120 (as also shown in FIG. 3D). Because the extension sidewalls 140 extend past the gate protection layer 210A, the gate electrode 111 is fully protected against accidental silicidation during this silicidation process.

Figure 3E:
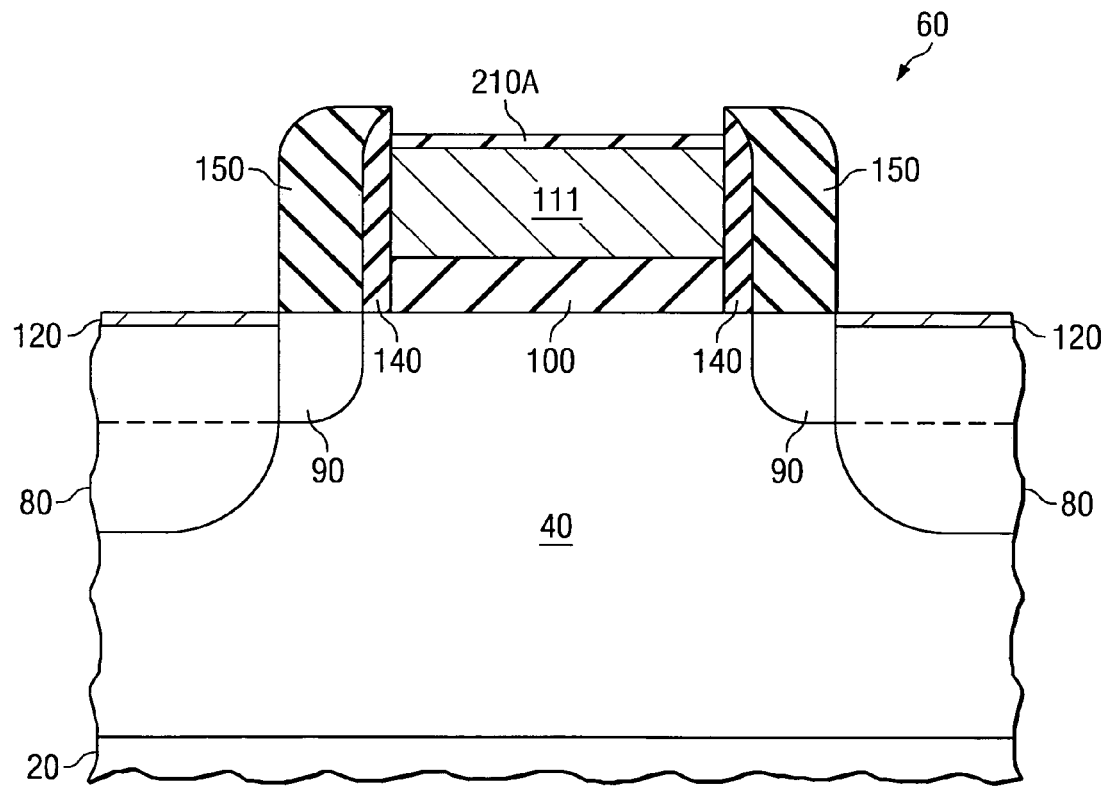
Figure 3F:
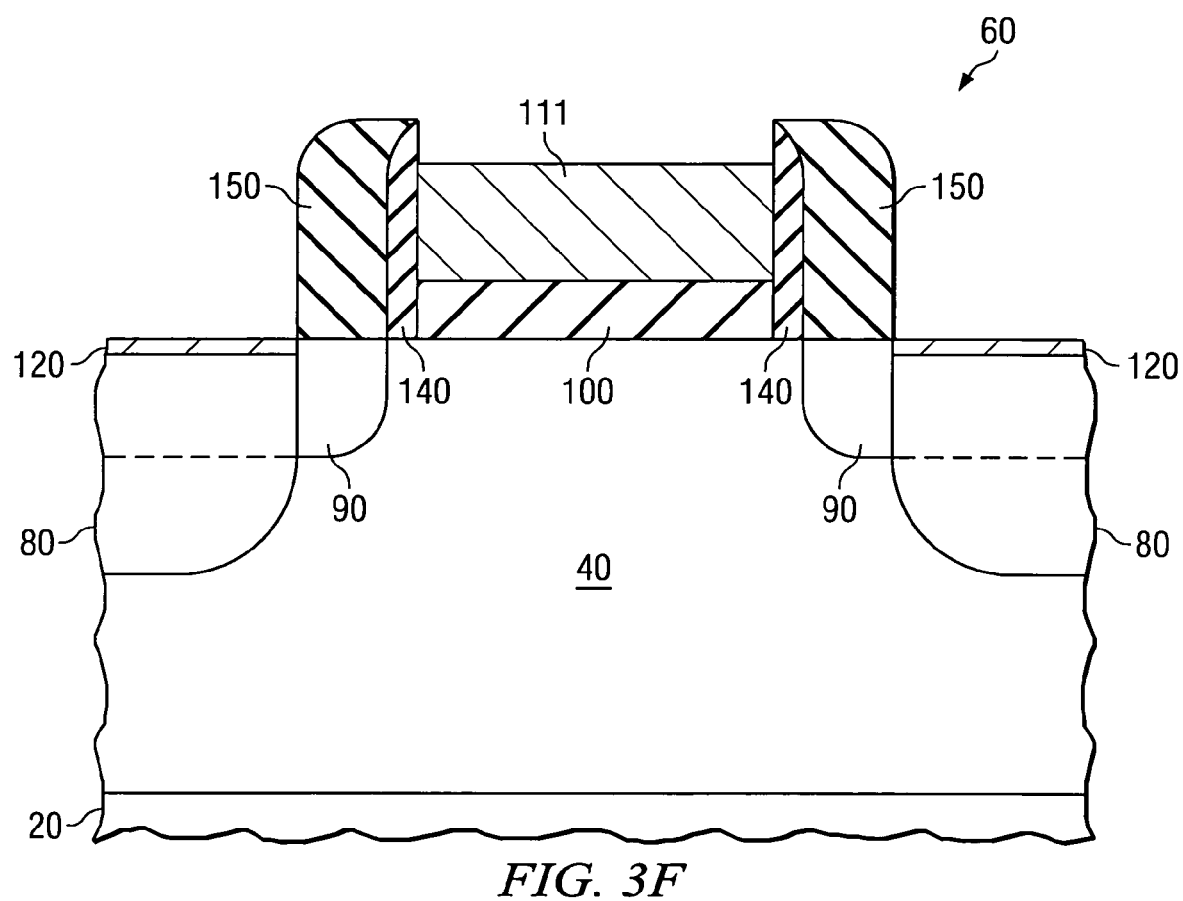

As shown in FIG. 3E, the un-reacted first layer of silicidation metal 220 and the capping layer 230 are now removed with a wet etch process and the semiconductor wafer 10 may now be subjected to a second RTA silicide anneal, as described above. Once the source/drain silicides 120 are formed, the gate protection layer 210A is removed with a wet etch process using phosphoric acid, as shown in FIG. 3F.

The fabrication process then continues with the formation of the FUSI gate electrode 110, as described above in reference to FIGS. 2M-2N. The transistor 60 fabricated with this alternative process flow will have a work function that is modulated by the source/drain 80 implantation process.

After the formation of source/drain silicides 120 and the gate FUSI 110 using any process flow described above, the fabrication of the semiconductor wafer 10 now continues, using standard process steps, until the semiconductor device is complete. Generally, the next step is the formation of the dielectric insulator layer 160 using plasma-enhanced chemical vapor deposition ("PECVD") or another suitable process (see FIG. 1). The dielectric insulator 160 may be comprised of any suitable material such as $SiO_2$ or OSG.

The contacts 170 are formed by etching the dielectric insulator layer 160 to expose the desired gate, source and/or drain. The etched spaces are usually filled with a liner 180 to improve the electrical interface between the silicide and the contact 170. Then contacts 170 are formed within the liner 180; creating the electrical interconnections between various semiconductor components located within the semiconductor substrate 20.

As discussed above, the fabrication of the final integrated circuit continues with the fabrication of the back-end structure. Once the fabrication process is complete, the integrated circuit will be tested and then packaged.

Various additional modifications to the invention as described above are within the scope of the claimed invention. As an example, interfacial layers may be formed between any of the layers shown. In addition, an anneal process may be performed after any step in the above-described fabrication process. When used, the anneal process can improve the microstructure of materials and thereby improve the quality of the semiconductor structure.

This invention may be implemented in a sidewall spacer structure that is comprised of different materials or layers than is described above. Moreover, this invention may be implemented in other semiconductor structures such as capacitors or diodes, and also in different transistor structures such as biCMOS and bipolar transistors.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for making PMOS and NMOS transistors on a semiconductor wafer, comprising:
   providing a semiconductor substrate;
   forming a gate oxide layer over said semiconductor substrate;
   forming a gate polysilicon layer over said gate oxide layer;
   implanting dopants into said gate polysilicon layer;
   forming a protection layer over said gate polysilicon layer
   etching said protection layer, said gate polysilicon layer, and said gate oxide layer to form gate stacks having a gate protection layer, a gate electrode, and a gate dielectric;
   implanting extension regions within a top surface of said semiconductor substrate;
   forming spacer sidewalls coupled to said extension sidewalls;
   implanting source/drain regions within a top surface of said semiconductor substrate;
   annealing said semiconductor wafer to create sources/drains;
   forming a first layer of silicidation metal over said semiconductor wafer;
   performing a silicide anneal to create a silicide within a top surface of said sources/drains; and
   removing said gate protection layer of said gate stacks.

2. The method of claim 1 wherein said protection layer includes silicon nitride.

3. The method of claim 2 wherein said silicon nitride protection layer is deposited by a rapid thermal CVD process using silane or dichlorosilane and ammonia as precursors.

4. The method of claim 1 wherein said protection layer has a thickness greater than 20 nm.

5. The method of claim 1 wherein said implanting step comprises:
   blanket ion implantation of said semiconductor wafer with a p-type dopant;

forming a layer of photoresist over said gate polysilicon layer, then patterning said layer of photoresist to expose NMOS regions of said NMOS transistors;

ion implantation of an n-type dopant into said exposed NMOS regions; and removing said patterned photoresist.

6. The method of claim 5 wherein said p-type dopant is boron.

7. The method of claim 5 wherein said n-type dopant is one or more dopant species selected from a group consisting of arsenic, phosphorous, and antimony.

8. The method of claim 1 wherein said implanting step comprises:

forming a layer of photoresist over said gate polysilicon layer, then patterning said layer of photoresist to expose PMOS regions of said PMOS transistors;

ion implanting a p-type dopant into said exposed PMOS regions;

removing said patterned photoresist;

forming another layer of photoresist over said gate polysilicon layer, then patterning said layer of photoresist to expose NMOS regions of said NMOS transistors;

ion implanting an n-type dopant into said exposed NMOS regions; and removing said patterned photoresist.

9. The method of claim 8 wherein said p-type dopant is boron.

10. The method of claim 8 wherein said n-type dopant is one or more dopant species selected from a group consisting of arsenic, phosphorous, and antimony.

11. The method of claim 1 wherein said protection layer has a thickness between 30-50 nm.

12. The method of claim 1 further including the step of forming extension sidewalls coupled to said gate stacks before said step of implanting extension regions, wherein said extension sidewalls contain a layer of silicon nitride formed with a CVD process using a BTBAS precursor.

13. The method of claim 1 wherein said first layer of silicidation metal comprises cobalt.

14. The method of claim 1 wherein said first layer of silicidation metal comprises nickel.

15. The method of claim 1 wherein said step of performing a silicide anneal comprises:

performing a first rapid thermal anneal;

etching said semiconductor wafer to remove unreacted portions of said first layer of silicidation metal; and performing a second rapid thermal anneal.

16. The method of claim 1 wherein said step of removing said gate protection layer comprises a wet etch process using a phosphoric acid solution.

17. The method of claim 1 wherein said silicide is a self-aligned silicide.

18. The method of claim 1 further comprising the step of forming a cap layer over said first layer of silicidation metal prior to said step of performing a silicide anneal.

19. The method of claim 18 wherein said cap layer comprises titanium nitride.

20. The method of claim 1 further comprising the steps of:

forming a second layer of silicidation metal over said semiconductor wafer; and performing a gate silicide anneal to create a gate silicide through a top portion of said gate electrode.

21. The method of claim 20 wherein said second layer of silicidation metal comprises nickel.

22. The method of claim 20 wherein said gate silicide is a self-aligned silicide and said gate electrode is fully silicided by said gate silicide anneal.

23. The method of claim 20 further comprising the step of forming a cap layer over said second layer of silicidation metal prior to said step of performing said gate silicide anneal.

24. A method for making PMOS and NMOS transistors on a semiconductor wafer, comprising:

providing a semiconductor substrate;

forming a gate oxide layer over said semiconductor substrate;

forming a gate polysilicon layer over said gate oxide layer; and forming a protection layer over said gate polysilicon layer, said protection layer having a top and bottom layer of silicon nitride coupled to a middle layer of silicon oxide;

etching said protection layer, said gate polysilicon layer, and said gate oxide layer to form gate stacks having a gate protection layer, a gate electrode, and a gate dielectric;

forming extension sidewalls coupled to said gate stacks;

implanting extension regions within a top surface of said semiconductor substrate;

forming spacer sidewalls coupled to said extension sidewalls;

removing said top layer of silicon nitride and said middle layer of silicon oxide of said gate protection layer;

implanting source/drain regions within a top surface of said semiconductor substrate;

annealing said semiconductor wafer to create sources/drains;

forming a first layer of silicidation metal over said semiconductor wafer;

performing a self-aligned silicide anneal process to create a silicide within a top surface of said sources/drains;

removing said bottom layer of silicon nitride of said gate protection layer;

forming a second layer of silicidation metal over said semiconductor wafer; and performing a gate silicide anneal to create a gate silicide within a top surface of said gate electrode.

25. The method of claim 24 wherein said protection layer has a thickness greater than 20 nm.

26. The method of claim 24 wherein said first layer of silicidation metal comprises cobalt.

27. The method of claim 24 wherein said second layer of silicidation metal comprises nickel.

28. The method of claim 24 wherein said step of performing said self-aligned silicide anneal process comprises:

performing a first rapid thermal anneal;

etching said semiconductor wafer to remove unreacted portions of said first layer of silicidation metal layer; and performing a second rapid thermal anneal.

29. The method of claim 24 further comprising the step of forming a cap layer over said first layer of silicidation metal prior to said step of performing said self-aligned silicide anneal process.

30. The method of claim 24 further comprising the step of forming a cap layer over said second layer of silicidation metal prior to said step of performing said gate silicide anneal.

* * * * *